(12) United States Patent
Galmiche et al.

(10) Patent No.: US 6,621,029 B2
(45) Date of Patent: Sep. 16, 2003

(54) SWITCH WITH CAPACITIVE CONTROL MEMBER AND PICTOGRAM

(75) Inventors: Etienne Galmiche, Etupes (FR); Denis Bocquet, Essert (FR)

(73) Assignee: Faurecia Industries, Boulogne Billancourt (FR)

(*) Notice: Subject to any disclaimer, the term of this patent is extended or adjusted under 35 U.S.C. 154(b) by 0 days.

(21) Appl. No.: 10/056,034

(22) Filed: Jan. 28, 2002

(65) Prior Publication Data
US 2002/0112942 A1 Aug. 22, 2002

(30) Foreign Application Priority Data

Jan. 26, 2001 (FR) ............................. 01 01118
Apr. 10, 2001 (FR) ............................. 01 04898

(51) Int. Cl.$^7$ ........................................ H03K 17/975
(52) U.S. Cl. ........................ 200/600; 200/511; 341/33
(58) Field of Search ........................ 200/511, 600; 341/33; 235/451; 178/18.06

(56) References Cited

U.S. PATENT DOCUMENTS

| | | | |
|---|---|---|---|
| 3,437,795 A | | 4/1969 | Kuljian .................... 200/52 R |
| 3,737,670 A | * | 6/1973 | Larson .................... 200/600 X |
| 4,022,296 A | | 5/1977 | Mandel et al. ............... 187/395 |
| 4,340,813 A | | 7/1982 | Sauer ...................... 250/229 X |
| 5,130,507 A | * | 7/1992 | Zuercher .................... 200/600 |
| 5,270,710 A | * | 12/1993 | Gaultier et al. .......... 200/600 X |
| 5,572,205 A | * | 11/1996 | Caldwell et al. ......... 200/600 X |
| 5,710,400 A | * | 1/1998 | Lorenz et al. ........... 200/600 X |
| 5,917,165 A | * | 6/1999 | Platt et al. .............. 200/511 X |
| 6,057,554 A | * | 5/2000 | Plesko .................... 235/462.48 |
| 6,376,787 B1 | * | 4/2002 | Martin et al. ................ 200/181 |

FOREIGN PATENT DOCUMENTS

| | | |
|---|---|---|
| EP | 0 887934 | 12/1998 |
| FR | 2737359 A1 * | 1/1997 |
| FR | 2779889 A1 * | 12/1999 |
| GB | 2 071 338 | 9/1981 |

* cited by examiner

Primary Examiner—J. R. Scott
(74) Attorney, Agent, or Firm—Young & Thompson

(57) ABSTRACT

A control member of the capacitive type for controlling at least one functional member in particular of a motor vehicle, the control member including a rigid support structure, at least one capacitive touch-sensitive detection cell located on or close to one of the faces of the support structure, and at least one control operating zone located on or close to the other face of the support structure in registration with the capacitive touch-sensitive detection cell, wherein the control operating zone includes an elastically deformable part.

20 Claims, 2 Drawing Sheets

SWITCH WITH CAPACITIVE CONTROL MEMBER AND PICTOGRAM

The present invention relates to a control member of the capacitive type for controlling at least one functional member in particular of a motor vehicle, and it also relates to a piece of vehicle equipment including such a member.

BACKGROUND OF THE INVENTION

Pieces of motor vehicle equipment are incorporating ever increasing numbers of control members for controlling functional members of vehicles.

Several pieces of equipment placed in the passenger compartment of a vehicle receive control members of this type, which are then made available to users of the vehicle.

By way of example, these pieces of equipment can be formed by door panels, the dashboard, or indeed a central console of the vehicle.

In general, control members are grouped together in control panels carrying various members, such as, for example, switches, pushbuttons, or indeed rotary knobs included in electrical circuits for controlling functional members.

However, it will be understood that such members present various drawbacks, in particular in terms of the space they occupy and their reliability, particularly since they make use of moving parts.

Another problem associated with using members of this type lies in the complexity of mounting and installing them on board a vehicle, requiring the use of fasteners (screws, panels, and the like) and assembly time that is relatively lengthy.

Touch-sensitive detectors are known in general terms from elsewhere.

Reference can be made for example to the following documents: FR-A-2 779 889, FR-A-2 737 359, U.S. Pat. Nos. 4,022,296, 5,572,205, and 5,270,710.

Those detectors operate on the principle of detecting a change in capacitance by means of an electrode placed, for example, on a printed circuit board beneath a control operating zone, with such variation in capacitance being subsequently analyzed and processed by an electronic circuit enabling some arbitrary function to be controlled.

Such detectors have the advantage of not presenting any moving parts, but they suffer from the drawback of no feedback to the user, and in particular no tactile feedback.

Thus, for example, with a touch-sensitive system of the kind described in document U.S. Pat. No. 5,572,205, where provision is made for a rigid support with a capacitive sensor on one face of the support and an operating zone in register therewith on the other face of the support, the user perceives no sensation of pressing a button.

That can be a drawback, particularly if the user is the driver of the vehicle and is pressing on the control members without looking at them.

Having no tactile feedback, the user can end up pressing several times on the operation zone, thereby running the risk of not obtaining the desired response.

In addition, that also raises problems with concentration on driving the vehicle.

Document U.S. Pat. No. 4,022,296 describes a control unit having capacitive control switches which likewise raises such problems.

OBJECT AND SUMMARY OF THE INVENTION

The object of the invention is thus to resolve these problems.

To this end, the invention provides a control member of the capacitive type for controlling at least one functional member in particular of a motor vehicle, the control member comprising a rigid support structure, at least one capacitive touch-sensitive detection cell located on or close to one of the faces of said support structure, and at least one control operating zone located on or close to the other face of said support structure in register with said capacitive touch-sensitive detection cell, wherein the control operating zone includes elastically deformable means.

According to other characteristics:

- the elastically deformable means are independent of controlling the functional member;
- the elastically deformable means have a rest position in which the finger of an operator in contact with the operating zone lines outside the touch detection volume, and a deformed position in which the finger of the operator in contact with the operating zone lies within the touch detection volume;
- the elastically deformable means are formed by a projecting portion of an intermediate piece of elastically deformable material fixed beneath the support structure;
- the rigid support structure carries a printed circuit board having the capacitive cell and a light source fixed thereon;
- the intermediate piece carries a printed circuit board having the capacitive cell and a light source fixed thereon;
- a mask representing a pictogram associated with the function controlled by the member is associated with the intermediate piece or with the printed circuit board;
- the control operating zone is marked by a portion in relief of the support structure; and
- the intermediate piece and the printed circuit board are of translucent material, and the light source is fixed beneath the printed circuit board.

According to another aspect, the invention also provides a piece of motor vehicle equipment fitted with at least one functional member control member as defined above.

According to other characteristics:

- it comprises a support structure having a flexible and translucent covering skin placed thereon, and the support structure includes at least on opening beneath which there are placed means constituting a touch-sensitive detector and a light source;
- the means forming a touch-sensitive detector are carried by a translucent printed circuit board with the light source fixed beneath it;
- the covering skin carries a mask representing a pictogram associated with the function controlled by the member;
- the printed circuit carries a mask representing a pictogram associated with the function controlled by the member;
- the opening in the support structure is of a shape representing a pictogram associated with the function controlled by the member;
- the opening in the support structure is formed in a portion in relief of said structure; and
- the means forming a touch-sensitive detector are connected to electronic analyzer means for controlling the functional member and for controlling the power of the light source.

BRIEF DESCRIPTION OF THE DRAWINGS

The invention will be better understood on reading the following description given purely by way of example and made with reference to the accompanying drawings, in which.

MORE DETAILED DESCRIPTION

Figure 1:
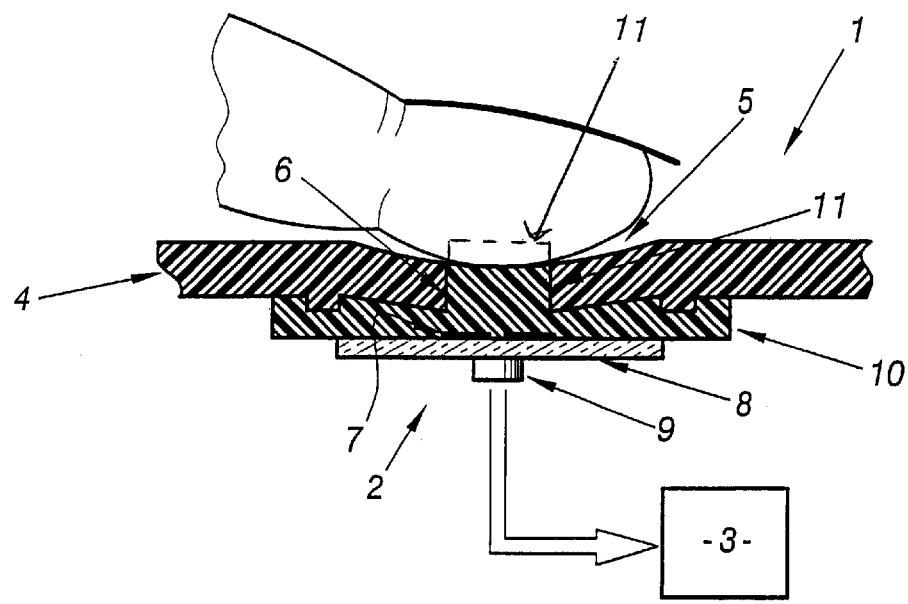
FIG. 1 is a diagrammatic section view showing the general structure of a piece of equipment of the invention.
Figure 2:
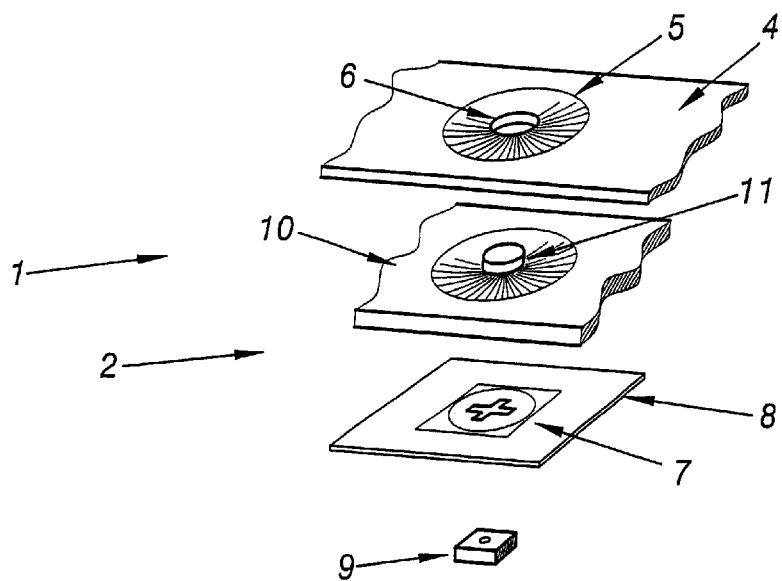
FIG. 2 is an exploded perspective view of such a structure.

FIGS. 1 and 2 show a piece of motor vehicle equipment which is given overall reference 1 and which is fitted with at least one control member given overall reference 2, for controlling a functional member 3 of the vehicle.

This piece of equipment comprises a rigid support structure given general reference 4 which itself has a control operating zone given general reference 5 and manifested in the example described by an indented, inward relief portion thereof.

This support structure includes at least one opening given general reference 6 in the operating zone 5.

Furthermore, the control member is provided with at least one touch-sensitive capacitive cell given general reference 7 in the figure, for example, carried by a translucent printed circuit board given general reference 8, and associated with a light source given general reference 9.

In the example described, the touch-sensitive capacitive detection cell 7 is fixed, by way of example, to a top face of the printed circuit board 8, while the light source is fixed to the other face thereof in register with the cell.

It should be observed that the top face of the printed circuit board carrying the cell could also be associated with a pictogram representing the control function performed by the member, and represented in the example described by a cross.

Other embodiments are described below.

This assembly comprising a printed circuit board, a capacitive detection cell, and a light source is placed on the rear face of an intermediate piece given general reference 10 in the figures, having a front face which is fixed against the structure 4 and including a projecting portion 11 that extends through the opening 6 of the support structure so as to project slightly beyond the structure in the indented portion of the operating zone.

By way of example, this piece 10 is made of a plastics material that is elastically deformable and translucent.

Such a structure then serves to protect the capacitive detection cell against external attack, and also to provide tactile feedback to the user on operating the control member, since as shown, when the user presses on the projecting portion 11 of the piece 10, the piece deforms elastically. The projection portion 11 is also shown with dashed lines to show its projection in upward relief with respect to control operating zones.

The difference in texture between the projecting portion 11 and the remainder of the support structure can also serve to give the user a feeling of pressing a control button, which has the advantage of not eliminating a user's tactile references, given that users are in the habit of feeling the presence and the movement of a button under the fingers.

This perception is nevertheless independent of the action of controlling the member, which action is provided solely on the basis of information coming from the detection cell.

As mentioned above, a pictogram can be associated with the control member to represent the function controlled thereby.

As also mentioned above, the pictogram can be defined in various ways.

Thus, for example, it can be implemented by means of a mask carried by the printed circuit board 8 on one or other of its faces, or by the piece 10 on one or other of its faces, in register with the opening 6.

The pictogram can also be defined by the opening 6 in the support structure presenting some suitable shape.

It will be understood that this structure represents a solution that is simple and reliable to integrating the control member in a piece of equipment for a motor vehicle insofar as the control member is completely integrated therein and does not require any moving parts.

The light source 9 illuminates the member and can itself be under the control of electronic means associated with said member, for example, to cause the light power emitted by the source to change whenever the member is activated or deactivated.

This makes it possible for the user also to have visual feedback concerning the control member in addition to tactile feedback.

Naturally, other embodiments of the system can be envisaged.

Thus, for example, the control member can be in the form of a slider.

The light source can also be placed in some manner other than that described, for example, to light the member indirectly, and more particularly to light its operating zone.

Finally, the pictogram associated with the member can be placed beside it, and more particularly beside the operating zone.

Figure 3:
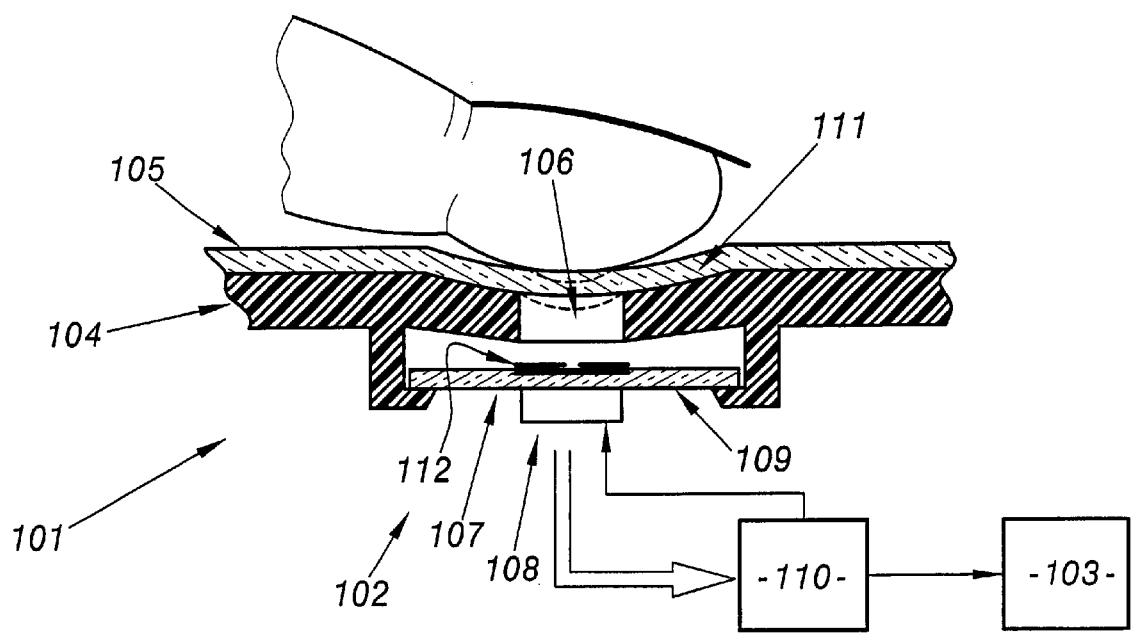
FIG. 3 is a diagrammatic section view showing the general structure of a variant embodiment of a piece of equipment of the invention.
Figure 4:
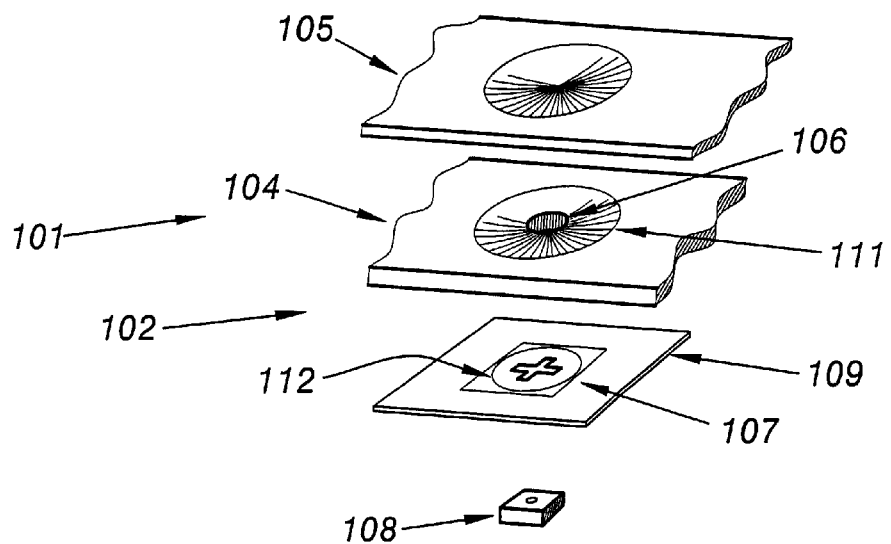
FIG. 4 is an exploded perspective view of such a structure.

FIGS. 3 and 4 show a variant embodiment of a piece of motor vehicle equipment which is given general reference 101, and which is fitted with at least one control member given general reference 102 for controlling a functional member 103 of the vehicle.

This piece of equipment comprises a support structure given general reference 104 and having a covering skin 105 placed thereon, said skin being flexible and translucent.

The support structure has at least one opening given general reference 106, beneath which there are placed touch-sensitive detector-forming means designated by general reference 107, together with a light source designated by general reference 108.

The skin can cover all or part of the support structure and it can extend in part into the opening 106 therein, for example.

The means constituting the touch-sensitive detector 107 are carried, for example, by a printed circuit board which is translucent, and rigid or flexible, given general reference 109 in the figures, and the light source 108 is placed beneath the printed circuit board. By way of example, this source can be constituted by a light-emitting diode (LED) or by some other component.

The means constituting the touch-sensitive detector and the light source are held in position by any suitable conventional fixing means.

In a conventional manner, these means constituting the touch-sensitive detector comprise, for example, an electrode for detecting a variation in capacitance when a user brings a finger close thereto, for example, and to respond to the change by delivering information which is processed by electronic analyzer means given general reference 110 in FIG. 3 for the purpose of controlling the functional member 103 accordingly.

In the embodiment shown in the figures, the opening 106 of the support structure is formed at the bottom of an indented portion 111 thereof.

A pictogram can be associated with the control member to represent the function that it controls.

The pictogram can be defined in various ways.

Thus, the covering skin 105 can carry a mask representing the pictogram associated with the function, which mask can be formed, for example, on the top face or on the bottom face of said skin in register with the opening 106.

It is also possible for the pictogram to be formed by a mask carried by the printed circuit board 109, as shown in the figure.

For this purpose, in the example described, the printed circuit board 109 has a mask on its top surface given general reference 112 and constituting the pictogram.

Naturally, the mask could also be carried by the bottom face of the circuit board.

Finally, the pictogram can also be defined by the opening 106 in the support structure which is then of appropriate shape.

It will be understood that this structure represents a simple and reliable solution to the problem of integrating the control member in a piece of motor vehicle equipment, insofar as the control member is fully integrated therein and does not require any moving parts.

The light source 108 serves to illuminate the member, and the source can itself be controlled, for example, by the electronic analyzer means 110 so as to cause the light power of the source 108 to change whenever the member is activated or deactivated.

This gives the user visual feedback concerning the control member.

The user also feels tactile feedback on actuating such a control member.

When the user presses the zone of the support structure that is in register with the control member, the user can feel said zone moving because of the presence of the flexible skin in register with the opening in the support structure.

The control operating zone has elastically deformable means which have a rest position in which the finger of the operator in contact therewith lies outside the touch-sensing volume, and a deformed position in which the finger of the operator in contact with the operation zones lies within the touch-sensing volume.

Naturally, other embodiments of the system could be envisaged.

For example, the control member could be in the form of a slider.

In the examples described, the operating zone is represented as an indentation, however any other form of relief could be used, for example it could constitute a projection.

Finally, the pictogram associated with the control member could be located beside it.

What is claimed is:

1. A switch, comprising:
   a translucent circuit board;
   a touch-sensitive cell mounted on an upper surface of said translucent circuit board and having connections for operating a functional member;
   a light source mounted on a lower surface of said translucent circuit board in vertical registration with said touch-sensitive cell;
   a translucent intermediate piece positioned over said translucent circuit board and said touch-sensitive cell, the intermediate piece in a rest state being contact free with said touch-sensitive cell and in a user-depressed state being in contact with said touch-sensitive cell to cause said touch-sensitive cell to operate the functional member;
   a support structure located above said intermediate piece and having an opening in vertical registration with said touch-sensitive cell; and
   a projecting portion located on an upper side of said intermediate piece extending above a local upper surface of said support structure through said opening.

2. The switch of claim 1, wherein,
   said touch-sensitive cell is a touch-sensitive capacitive cell,
   said intermediate portion is a plastic elastically deformable layer, and
   user depression of said intermediate portion via said projecting portion provides a tactile sensation of pressing a button.

3. The switch of claim 1, wherein said support structure further comprises an indented portion surrounding said opening.

4. A capacitive control member for controlling a functional member, comprising:
   a rigid support structure having a first face and an opposing second face;
   at least one capacitive touch-sensitive detection cell facing the first face of said support structure; and
   at least one control operating zone located over the second face of said support structure and in registration with said detection cell,
   the control operating zone comprising an elastically deformable element operable via an operator depression to activate said detection cell.

5. The control member of claim 3, wherein,
   said elastically deformable element is spaced apart from the detection cell; and
   said detection cell is structured to control a functional member.

6. The control member of claim 4, wherein,
   said detection cell has a touch detection volume,
   said elastically deformable element has a rest position and a deformed position,
   a finger of the operator in contact with the elastically deformable element in the rest position lies outside the touch detection volume, and
   the finger of the operator in contact with the elastically deformable element in the deformed position lies within the touch detection volume.

7. The control member of claim 4, wherein,
   the elastically deformable element comprises a projecting portion of an intermediate piece made of an elastically deformable material and located intermediate said support structure and said detection cell.

8. The control member of claim 7, further comprising:
   a printed circuit board carried by said support structure; and
   a light source fixed on said printed circuit board,
   wherein said detection cell is fixed on said printed circuit board.

9. The control member of claim 7, further comprising:
   a printed circuit board carried on said intermediate piece; and a light source fixed on said printed circuit board, wherein said detection cell is fixed on said printed circuit board.

10. The control member of claim 4, further comprising a mask with a pictogram indicating a function controlled by said control member.

11. The control member of claim 4, wherein said control operating zone comprises a portion in relief with respect to a surrounding part of said support structure.

12. The control member of claim 8, wherein, said intermediate piece is translucent;

said printed circuit board is translucent; and said light source is fixed beneath said printed circuit board.

13. A motor vehicle equipment, comprising:

a functional member; and a control member operatively connected to said functional member for controlling a function of said functional member, said control member for controlling said functional member comprising a rigid support structure having a first face and an opposing second face;

at least one capacitive touch-sensitive detector facing the first face of said support structure; and at least one control operating zone located over the second face of said support structure and in registration with said detector, the control operating zone comprising an elastically deformable element operable via an operator depression to activate said detector.

14. The motor vehicle equipment of claim 13, further comprising:

a flexible and translucent covering skin placed on said support structure;

a light source; and an opening within said support structure, said touch-sensitive detector and said light source being located beneath said opening.

15. The motor vehicle equipment of claim 14, further comprising:

a translucent printed circuit board, said circuit board carrying said touch-sensitive detector, and said light source being carried by said circuit board beneath said circuit board.

16. The motor vehicle equipment of claim 14, further comprising:

a mask representing a pictogram associated with the function controlled by said control member, the mask being carried by said covering skin.

17. The motor vehicle equipment of claim 15, further comprising:

a mask representing a pictogram associated with the function controlled by said control member, the mask being carried by said printed circuit.

18. The motor vehicle equipment of claim 14, wherein said opening is of a shape representing a pictogram associated with the function controlled by said control member.

19. The motor vehicle equipment of claim 14, wherein said opening is formed in a portion of said support structure in relief with respect to a surrounding part of said support structure.

20. The motor vehicle equipment of claim 14, further comprising:

an electronic analyzer connecting said touch-sensitive detector and said functional member, such electronic analyzer operatively connected to said light source for controlling a power of said light source.

* * * * *